United States Patent
Watanabe et al.

(10) Patent No.: US 6,877,518 B2
(45) Date of Patent: Apr. 12, 2005

(54) CHEMICAL SOLUTION TREATMENT APPARATUS FOR SEMICONDUCTOR SUBSTRATE

(75) Inventors: Kaori Watanabe, Kanagawa (JP); Hidemitsu Aoki, Kanagawa (JP); Norio Ishikawa, Tokyo (JP); Kiyoto Mori, Tokyo (JP)

(73) Assignees: NEC Electronics Corporation, Kanagawa (JP); Kanto Kagaku Kabushiki Kaisha, Tokyo (JP)

( * ) Notice: Subject to any disclaimer, the term of this patent is extended or adjusted under 35 U.S.C. 154(b) by 154 days.

(21) Appl. No.: 10/309,132

(22) Filed: Dec. 4, 2002

(65) Prior Publication Data

US 2003/0168088 A1 Sep. 11, 2003

(30) Foreign Application Priority Data

Dec. 4, 2001 (JP) ........................................ 2001-370321

(51) Int. Cl.[7] .............................................. B08B 15/00
(52) U.S. Cl. ................... 134/104.4; 134/94.1; 134/153; 134/149; 134/902
(58) Field of Search ................................ 134/902, 153, 134/108, 149, 104.4, 94.1, 104.2

(56) References Cited

U.S. PATENT DOCUMENTS 2,921,868 A * 1/1960 Berger ........................ 428/650
4,812,201 A * 3/1989 Sakai et al. ................. 438/725
6,682,971 B2 * 1/2004 Tsuneda et al. ............. 438/240
2001/0039115 A1 * 11/2001 Tsuneda et al. ............. 438/650

FOREIGN PATENT DOCUMENTS

| JP | 62-30525 | 2/1987 |
|----|----------|--------|
| JP | 3-108333 | 5/1991 |
| JP | 6-84873 | 3/1994 |
| JP | 10-223593 | 8/1998 |
| JP | 11-54472 | 2/1999 |
| JP | 11-165116 | 6/1999 |
| JP | 2001-234373 | 8/2001 |
| JP | 2001-237389 | 8/2001 |

* cited by examiner

Primary Examiner—Frankie L. Stinson
(74) Attorney, Agent, or Firm—Young & Thompson

(57) ABSTRACT

A chemical solution treatment apparatus for dissolving and removing ruthenium-based metal adhering to a substrate by a chemical solution, includes: a chemical solution treatment unit; a reservoir unit; and a chemical solution circulation system. The chemical solution inside treatment unit comprises a chemical solution supplying nozzle, and a recovering mechanism. The reservoir unit has a structure having a clearence part to be in contact with the chemical solution so that gas components derived from the ruthenium-based metal dissolved and removed in said chemical solution treatment are volatilized outside the chemical solution during circulation of the chemical solution, and comprises an exhaust duct.

12 Claims, 5 Drawing Sheets

CHEMICAL SOLUTION TREATMENT APPARATUS FOR SEMICONDUCTOR SUBSTRATE

TECHNICAL FIELD

The present invention relates to a chemical solution treatment apparatus of semiconductor substrates to remove ruthenium-based metal.

BACKGROUND OF THE INVENTION

Recently, in semiconductor devices such as DRAM and FeRAM, a high dielectric-constant film such as $Ta_2O_5$ is used as a capacitance insulating film in order to ensure a necessary accumulated capacitance in a small occupied area and to improve a degree of memory cell integration.

When such a high dielectric-constant film is used for the capacitance insulating film, it is important to select a material which does not form an insulating film by oxidization as a material of electrodes sandwiching the capacitance insulating film. Oxygen is liberated from such a high dielectric-constant film in a thermal treatment process of a semiconductor device, and the electrodes made of polysilicon or the like are oxidized to form an oxide film with a low dielectric-constant, leading to reduction in capacitance.

As an electrode material which does not cause such a capacitance reduction, much attention is paid to ruthenium recently. Ruthenium has electric conductivity, even if it is oxidized, and it is inexpensive, which makes it favorable as an electrode material.

However, when an electrode is formed using ruthenium, ruthenium-based metal (ruthenium, ruthenium oxide or the like) may adhere to the end face or the rear face of the silicon substrate, and its peeled materials may adhere to the device forming area and may cause cross-contamination between the devices and between the wafers via the transfer system. Since ruthenium-based metal is known as so-called a lifetime killer for a semiconductor device, and has a high diffusion rate, if only a little ruthenium-based metal remains on the silicon substrate surface, the device properties may be reduced and reliability of the devices may be impaired.

Especially, in recent years, forming a electrode film in a narrow hole is demanded to reduce the occupied area of a capacitor, and from the necessity of forming a uniform ruthenium-based metal film with a small film thickness, the necessity of forming the film with use of a CVD method having good coverage ability increases. If the film is formed according to such a CVD method, ruthenium-based metal adheres to the end face and the rear face of the silicon substrate more heavily, and the above-described problem becomes more serious.

In order to solve the above problem, it is important to remove unneeded ruthenium-based metal by treatment using a chemical solution after forming a ruthenium-based metal film.

There are few chemical solutions which can sufficiently dissolve and remove the ruthenium-based metal, but Japanese Patent Laid-open No. 2001-234373 and Japanese Patent Laid-open No. 2001-237389 disclose a remover solution comprising salt including quadrivalent cerium ion or periodic acid and a specified acid as chemical solution suitable for cleaning wafer. Especially in Japanese Patent Laid-open No. 2001-234373, a detailed study results about the remover solution comprising (a) cerium (IV) nitrate salt, and at least one acid selected from the group consisting of (b) nitric acid, perchloric acid and acetic acid are described.

Further, as a method of using the above-described chemical solution, Japanese Patent Laid-open No. 2001-234373 discloses a method of removing ruthenium-based metal adhering to the area except the device forming area by holding a semiconductor substrate substantially horizontally to rotate it after forming a ruthenium-based metal film on the semiconductor substrate, and by spraying the remover solution onto a predetermined area while spraying a nitrogen gas onto the device forming surface of the semiconductor substrate. It is described that in this method, the remover solution is in contact with only the end face and the rear face of the substrate by spraying the nitrogen gas onto the device forming surface of the semiconductor substrate.

Further, Japanese Patent Laid-open No. 2001-237389 discloses a method for manufacturing a semiconductor device comprising a step of holding the semiconductor substrate substantially horizontally to rotate it after forming the ruthenium-based metal film, spraying the remover solution onto predetermined parts while spraying a gas or a liquid onto the surface having an device forming area of the semiconductor substrate and removing the ruthenium-based metal adhering to areas other than device forming area.

Incidentally, there are a single wafer type and a batch type as a wafer cleaning or wet etching apparatus. A single wafer type of apparatus is for transferring wafers into the treatment tank to treat it one by one, in which a liquid is sprayed to the surface of the wafer while the wafer is rotated, that is a spinning method, so that washing or etching is performed. The aforementioned method of removing ruthenium-based metal is performed using the single wafer type of apparatus with the spinning method. On the other hand, the batch type of apparatus is for treating a plurality of wafers in the treatment tank at one time, in which a plurality of wafers are arranged in line to immerse them at one time, that is a dip method, so that washing or etching is performed.

As the single wafer type of apparatus, Japanese Patent Laid-open No. 10-223593 discloses a single wafer type wafer cleaning apparatus which cleans a wafer in the state of floating and rotating in a predetermined direction, and comprising a cleaning tank having a first blast port for blasting a cleaning solution from the side of a top surface of the wafer, and a stage having a second blast port for blasting the cleaning solution from the side of a undersurface of the wafer, and performing cleaning by allowing the cleaning solution blasted out from the first and second blast ports to spread uniformly over the entire top surface and the entire undersurface of the wafer by a centrifugal force by the rotation of the wafer. It is also described that a blast port for floating and a blast port for rotation are set up around the second blast port of the stage, and mediums such as pure water and air are blasted from these blast ports in order to rotate the wafer in the predetermined direction while floating it. Further, waste liquid of the cleaning solution accumulated in the cleaning tank is recovered by the waste liquid treatment apparatus via a waste liquid discharge passage set up at the bottom of the cleaning tank, and is subjected to filtering treatment to be reused.

On the other hand, as a batch type (dip type) of apparatus, Japanese Patent Laid-open No. 3-108333 discloses a wet etching apparatus including a treatment tank in which an object to be treated is in contact with an etching solution composed of hydrofluoric acid, and a circulation passage for circulating the etching solution into the treatment tank, and having a reaction product removing device, which is constructed to heat the etching solution to gasify reaction products and discharge the gas outside the solution, in the circulation passage.

SUMMARY OF THE INVENTION

An object of the present invention is to provide a chemical solution treatment apparatus capable of removing ruthenium-based metal on a semiconductor substrate efficiently in a better operation environment by using a specific chemical solution.

The present invention provides a chemical solution treatment apparatus for dissolving and removing ruthenium-based metal adhering to a semiconductor substrate by a chemical solution, comprising:

a chemical solution treatment unit which make the semiconductor substrate come into contact with said chemical solution;

a reservoir unit for storing the chemical solution which is used in said chemical solution treatment unit; and a chemical solution circulation system having said reservoir unit, a chemical solution supplying means for supplying the chemical solution inside said reservoir unit to said chemical solution treatment unit, and a chemical solution returning means for returning the chemical solution, which is used and recovered in said chemical solution treatment unit, to said reservoir unit, wherein:

said chemical solution treatment unit comprises a chemical solution supplying nozzle for supplying the chemical solution to the semiconductor substrate, and a recovering mechanism for recovering the used chemical solution;

said reservoir unit has a structure having a clearance part to be in contact with the chemical solution so that gas components derived from the ruthenium-based metal dissolved and removed in said chemical solution treatment are volatilized outside the chemical solution during circulation of the chemical solution, and comprises an exhaust duct to forcefully exhaust said volatilized gas components out of said reservoir unit; and the residence time of the chemical solution in the chemical solution treatment unit after coming in contact with the semiconductor substrate is shorter than the residence time of the chemical solution in the reservoir unit.

According to the present invention, the above described chemical solution treatment apparatus comprising a removing means for removing said gas components inside a passage of said exhaust duct is provided.

"Ruthenium-based metal" refers to ruthenium, an alloy containing ruthenium, and ruthenium compounds. Further, it refers to a material containing ruthenium, which are dissolved and removed in the chemical solution to be used, and the dissolved components in the chemical solution which is formed are gradually changed with time at an ordinary temperature and pressure to be able to generate gas components (hereinafter, called "Ru gas components" as appropriate).

According to the present invention, the dissolved components of ruthenium-based metal, which are dissolved and removed in the chemical solution treatment, are made to remain for a predetermined time in the reservoir unit separated from the chemical solution treatment unit, whereby they are sufficiently changed to Ru gas components, and discharged. As a result, the following effects can be obtained.

On circulating and reusing the chemical solution, the amount of a ruthenium component in the chemical solution which is supplied from the reservoir unit to the chemical solution treatment unit can be reduced, and therefore 1) reduction in the performance of the chemical solution can be suppressed. Since generation of a Ru gas component from the chemical solution supplied to the chemical solution treatment unit can be suppressed, 2) leakage of a Ru gas component to the outside from the chemical solution treatment unit is suppressed, and contamination of the operation environment can be prevented, and further, 3) contamination caused by adherence of a ruthenium-based material derived form a Ru gas component inside the chemical solution treatment unit can be prevented (the Ru gas component derived from the ruthenium-based metal has a property of changing into a solid component to easily adhere when it comes in contact with a wall surface).

By providing the removing means of the Ru gas component inside the passage of the exhaust duct in the reservoir unit, 4) Adherence of the ruthenium-based material derived from the Ru gas component in the exhaust system connected to the chemical solution treatment apparatus can be prevented, and 5) leakage of the Ru gas component to the outside from the exhaust system connected to the chemical solution treatment apparatus can be suppressed, thereby making it possible to prevent air pollution.

As described above, according to the present invention, when the chemical solution is circulated to be reused, and chemical solution treatment is performed for a number of semiconductor substrates, the chemical solution treatment can be efficiently performed under a better operation environment.

DETAILED DESCRIPTION OF THE EMBODIMENTS

A preferable chemical solution for the present invention can dissolve ruthenium-based metal at ordinary temperature, generate a gas component (Ru gas component) derived from the dissolved ruthenium-based metal at ordinary temperature and pressure, and further can allow the dissolved component in the chemical solution, that are derived from the ruthenium-based metal, to gradually change with time at ordinary temperature and pressure and generate a Ru gas component.

Such a chemical solution include a chemical solution (hereinafter, called "chemical solution A" as appropriate) containing at least one compound selected from the group consisting of cerium (IV) nitrate salt and periodic acid (component (a)), and at least one acid selected from the group consisting of nitric acid, perchloric acid and acetic acid (component (b)).

Figure 1:
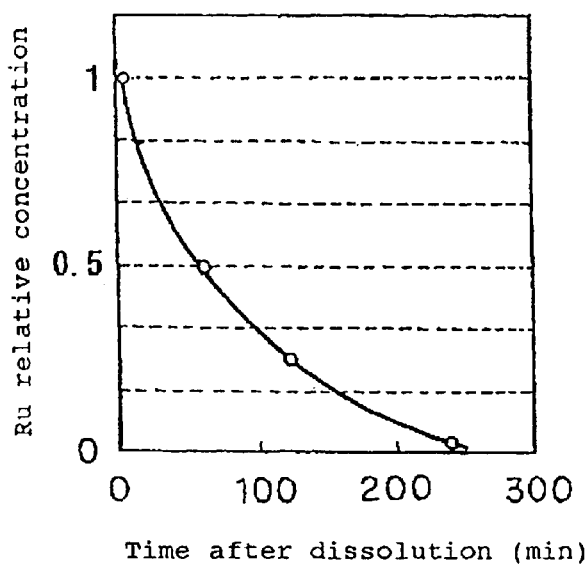
FIG. 1 shows the change of the amount of ruthenium components dissolved in the chemical solution with time.

The chemical solution A has a remarkable ruthenium-based metal removing performance, and can sufficiently remove ruthenium-based metal adhering to a substrate surface even at ordinary temperature. The chemical solution oxidizes and removes ruthenium-based metal by oxidation ability of $Ce^{4+}$ or the like contained in the chemical solution, and Ru gas components generate from the chemical solution in which the ruthenium-based metal is dissolved, at ordinary temperature and pressure with time. It is considered that dissolved components such as ruthenium hydroxides are temporarily formed, and these dissolved components are gradually further oxidized to be changed into the gas components such as ruthenium oxides. FIG. 1 shows the change of the amount of ruthenium components in the chemical solution with time in relative values. This is the result of dissolving ruthenium in the chemical solution A at 30° C. in a beaker without a lid, and measuring the amount of ruthenium components dissolved in the chemical solution at predetermined intervals while stirring the chemical solution.

If such a chemical solution A is circulated and continuously used, the accumulated ruthenium components gradually become Ru gas components, and are volatilized. There is the possibility that the volatilized Ru gas components adhere to the inner wall to be solidified and contaminate the inside of the chemical solution treatment unit, or flow outside the chemical solution treatment unit to deteriorate the operation environment.

The chemical solution treatment apparatus of the present invention comprises a reservoir unit in a chemical solution circulation system separately from a chemical solution treatment unit, and this reservoir unit has a structure so that the recovered chemical solution is stored for a predetermined time to volatilize the ruthenium components in the chemical solution sufficiently, and the volatilized Ru gas components are exhausted from the reservoir unit. Due to the structure, at the time of circulation of the chemical solution, the amount of the ruthenium components in the chemical solution can be kept a predetermined value or less, thus making it possible to suppress the reduction in the performance of the chemical solution and to prevent the contamination of the inside of the chemical solution treatment unit and operation environment.

Figure 2:
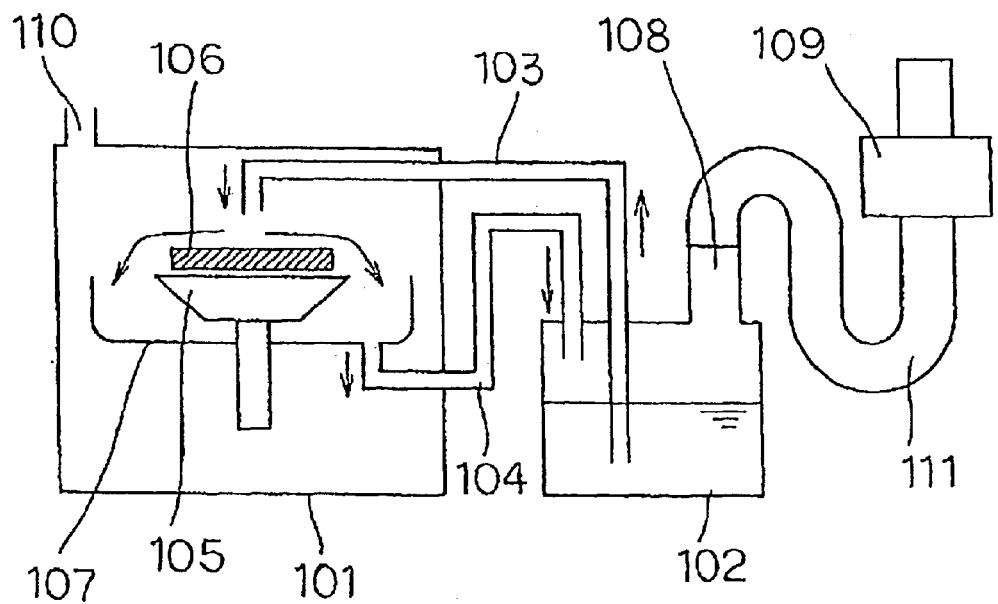
FIG. 2 shows an example of a chemical solution treatment apparatus of the present invention.

FIG. 2 shows a schematic diagram of an embodiment of the present invention. In the drawing, reference numeral 101 denotes a chemical solution treatment unit, reference numeral 102 a reservoir unit, reference numeral 103 a chemical solution supplying means, reference numeral 104 a chemical solution returning means, reference numeral 105 a support medium, reference numeral 106 a semiconductor substrate, reference numeral 107 a waste liquid housing tank, reference numeral 108 an exhaust duct, reference numeral 109 a removal filter, reference numeral 110 an exhaust duct, and reference numeral 111 a bent pipe.

In the present invention, a chemical solution circulation system connected to the chemical solution treatment unit 101 has the reservoir unit 102, the chemical solution supplying means 103 for supplying the chemical solution inside the reservoir unit 102 to the chemical solution treatment unit 101, and the chemical solution returning means 104 for supplying the chemical solution used and recovered in the chemical solution treatment unit 101 to the reservoir unit 102.

In FIG. 2, a spin type structure of a single wafer type is shown as the chemical solution treatment unit 101, and this structure is one of preferable examples for a cleaning process in a method for manufacturing a semiconductor device as will be described later. The chemical solution treatment unit in the chemical solution treatment apparatus of the present invention has a configuration which is designed so that a residence time of the chemical solution in the chemical solution treatment unit after contacting the semiconductor substrate is shorter than a residence time of the chemical solution in the reservoir unit. In other words, the chemical solution treatment unit in the present invention has a configuration so that the chemical solution after contacting the semiconductor substrate (wafer) is discharged from the chemical solution treatment unit as quickly as possible. In the present invention, other than the spin type structure of a single wafer type shown in FIG. 2, a spin type structure of a batch type can be adopted. It is possible to adopt a dip type structure if it meets the above-described conditions and is able to discharge the used chemical solution from the chemical solution treatment unit quickly enough. If the chemical solution dissolving ruthenium-based metal after the treatment is stored in the chemical solution treatment unit for a long time, there is the possibility that Ru gas components are volatilized from the chemical solution, and are solidified and adhere to the inner wall of the chemical solution treatment unit, or flow outside the chemical solution treatment unit to deteriorate the operation environment. Irrespective of a batch type or a single wafer type, the chemical solution treatment unit having an ordinary spin type structure has the configuration so that the chemical solution after coming into contact with the semiconductor substrate is discharged from the chemical solution treatment unit as quickly as possible, and therefore it is preferable in a chemical solution treatment apparatus of the present invention.

The reservoir unit 102 is connected to the chemical solution supplying means 103 and the chemical solution returning means 104 communicating with the chemical solution treatment unit, and is constructed to have a clearance part to be in contact with the chemical solution so that the Ru gas components can be sufficiently volatilized outside the chemical solution during circulation of the chemical solution.

An open end of a circulation passage constructing the chemical solution supplying means 103 at the side of the reservoir unit 102 is placed to be in the chemical solution inside the reservoir unit 102, for example, near a bottom of the reservoir unit. On the other hand, an open end of a circulation passage constructing the chemical solution returning means 104 at the side of the reservoir unit 102 is preferably placed outside the chemical solution inside the reservoir unit in terms of prevention of the back-flow of the chemical solution. Each of the chemical solution supplying means 103 and the chemical solution returning means 104 may comprise a solution feeding means such as a pump. The chemical solution supplying means 103 can feed the chemical solution inside the reservoir unit to the outside of the reservoir unit, and the chemical solution returning means 104 can feed the chemical solution used and recovered in the chemical solution treatment unit into the reservoir unit.

The reservoir unit 102 comprises the exhaust duct 108 so that the gas components volatilized in the clearance part to be in contact with the chemical solution inside the reservoir unit can be forcefully exhausted. The exhaust duct can be connected to a duct comprising a forceful exhaust apparatus generally installed in a factory or the like.

The removal filter 109 for removing the Ru gas components may be attached inside a passage of the exhaust duct 108 of the reservoir unit 102. As the removal filter 109, a filter using a known adsorbent which can adsorb ordinary gas components can be used, and for example, activated carbon, silica gel, sintered polyethylene or the like can be used. Among them, activated carbon can be preferably used, and activated carbon in a sponge form can be more preferably used. For example, when commercially available activated carbon in a sponge form (trade name "HONEYCOMB CARBO SHIRASAGI" manufactured by TAKEDA CHEMICAL INDUSTRIES, LTD) is used, 97% of Ru gas components can be trapped even after seven hours. The trapping rate of the Ru gas components is measured as follows. First, a wafer with an Ru film was put into the chemical solution in a container having an exhaust duct, then while gas in the container was forcefully discharged by an aspirator from the exhaust duct, and the volatilized Ru gas components were adsorbed in the adsorbent attached inside the passage of the exhaust duct, Ru was dissolved and volatilized by a predetermined amount. After all Ru in the chemical solution was volatilized, the adsorption amount of the Ru gas components was obtained from the weight change of the adsorbent, and the trapping rate of the Ru gas components was obtained from the adsorption amount and the amount of Ru dissolved in the chemical solution.

Using a removing means such as the above removal filter can prevent contamination by adherence of ruthenium-based materials derived from the Ru gas components in a exhaust system connected to a exhaust duct in a reservoir unit. Leakage of the Ru gas components to the outside from the exhaust system is reduced, and air contamination can be prevented.

The bent pipe 111 capable of flocculating water in the gas exhausted from the reservoir unit 102 may be connected to the exhaust duct 108 of the reservoir unit 102, and may be equipped with the removal filter 109 at a subsequent stage. This makes it possible to reduce the adsorption amount of water to the removal filter, and therefore life span of the removal filter can be extended.

The chemical solution circulation system explained above may be designed depending on the total amount of the chemical solution circulated and the feed rate of the chemical solution to the chemical solution treatment unit (or the feed rate of the chemical solution to the reservoir unit from the chemical solution treatment unit), so that the chemical solution can be stored in the reservoir unit for a predetermined time. The amount of the chemical solution inside the reservoir unit can be set depending on a predetermined average storing time in the reservoir unit, and the volumetric capacitance of the reservoir unit can be set depending on the amount of the chemical solution and the volumetric capacitance of the clearance part to be in contact with the chemical solution.

It is preferable to set the average storing time of the chemical solution in the reservoir unit so that the amount of the ruthenium components in the chemical solution supplied to the chemical solution treatment unit from the reservoir unit is kept to be a predetermined amount or less during the circulation of the chemical solution. The amount of the ruthenium components in the chemical solution supplied to the chemical solution treatment unit from the reservoir unit is preferably 2 ppm or less.

It is preferable to perform forceful exhaust from the reservoir unit continuously at least during circulation of chemical solution, while the chemical solution is stored in the reservoir unit. When the predetermined time is set and the chemical solution circulation system is designed as described above, it is preferable to set a large amount in consideration of variations in the amount of ruthenium-based metal dissolved and removed from the semiconductor substrate at each treatment, as the amount of the ruthenium components in the chemical solution recovered to the reservoir unit from the chemical solution treatment unit, and to design based on the set amount having a margin.

By designing and constructing the chemical solution circulation system as described above, even after a number of semiconductor substrates are treated, the amount of the ruthenium components in the chemical solution circulated can be kept to be a predetermined value or less. As a result, even if the chemical solution treatment unit is opened in an optional timing for the purpose of replacing the semiconductor substrate to be treated or for any other purpose, volatilization of the Ru gas components from the chemical solution can be suppressed, and the operation environment is greatly improved. Furthermore, the life span of the chemical solution can be extended, and contamination of the chemical solution treatment unit, the exhaust system or the like can be prevented.

On designing the chemical solution circulation system, it is preferable to design the contact area of the chemical solution inside the reservoir unit and the clearance part (gas phase) to be in contact with the chemical solution depending on the forceful exhaust velocity of the reservoir unit. Namely, by increasing the contact area under the condition of performing sufficient exhaust from the reservoir unit, Ru gas components are more efficiently volatilized to the clearance part and exhausted from the reservoir unit.

Further, the reservoir unit 102 may comprise a stirring mechanism so as to mix the chemical solution fed from the chemical solution treatment unit 101 with the chemical solution already stored in the reservoir unit 102 sufficiently and promote volatilization of the Ru gas components into the clearance part from the chemical solution. The reservoir unit may have a known structure so that the gas-liquid contact area increases on the inward side so as to increase the volatilization speed of the Ru gas components. The reservoir unit main body may have a configuration designed so that the gas-liquid contact area increases so as to increase the volatilization speed of the Ru gas components.

The chemical solution A, which is preferable for the present invention, can sufficiently dissolve ruthenium-based metal at ordinary temperature, and therefore the chemical solution treatment apparatus of the present invention need not necessarily comprise a heating device or a cooling device when the chemical solution A is used. However, in terms of performing stable chemical solution treatment at a constant temperature, the chemical solution treatment apparatus may comprise a temperature control means capable of keeping the temperature of the chemical solution near an ordinary temperature. When the component (a) is cerium (IV) nitrate salt, it is preferable to control the chemical solution temperature at a substantially constant temperature, preferably in the range of 10 to 50° C., more preferably in the range of 20 to 40° C. When the component (a) is periodic acid, it is preferable to control the chemical solution at a substantially constant temperature, preferably in the range of 50 to 60° C.

The chemical solution circulation system may have a second reservoir unit additionally at a rear stage of the reservoir unit 102. The second reservoir unit is not particularly restricted in structure if it can be set up at the rear stage of the first reservoir unit 102 of the circulation system, and the chemical solution can be temporarily stored in it. The second reservoir unit may not have a clearance part to be in contact with the chemical solution or an exhaust duct for forceful exhaust. The second reservoir unit may be used so as to replace the chemical solution and to adjust the total amount of the chemical solution by draining the chemical solution from the circulation system and supplying it into the circulation system, and to replenish volatilized water. The first reservoir unit 102 may be also used so as to replace the chemical solution and to adjust the total amount of the chemical solution by draining the chemical solution from the circulation system and supplying it into the circulation system, and to replenish volatilized water.

Figure 3:
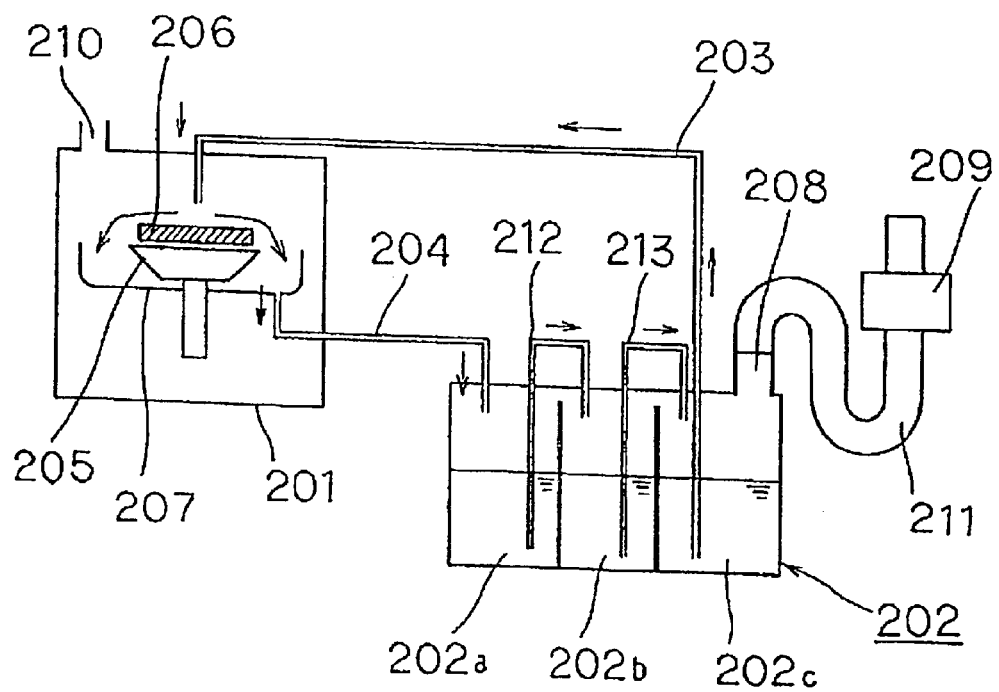
FIG. 3 shows another example of a chemical solution treatment apparatus of the present invention.

FIG. 3 shows another embodiment of the chemical solution treatment apparatus of the present invention.

The chemical solution treatment apparatus shown in FIG. 3 has the same structure as explained above using of FIG. 2 other than a reservoir unit 202. In the drawing, reference numeral 201 denotes a chemical solution treatment unit, reference numeral 202 a reservoir unit, reference numeral 203 a chemical solution supplying means, reference numeral 204 a chemical solution returning means, reference numeral 205 a support medium, reference numeral 206 a semiconductor substrate, reference numeral 207 a waste liquid housing tank, reference numeral 208 an exhaust duct, reference numeral 209 a removal filter, reference numeral 210 an exhaust duct, and reference numeral 211 a bent pipe.

The reservoir unit 202 has a receiving tank 202a for receiving the chemical solution recovered from the chemical solution treatment unit, a residence tank 202b for allowing the chemical solution from the receiving tank 202a to remain therein, and a supplying tank 202c for receiving the chemical solution from the residence tank 202b and supplying it outside the reservoir unit.

In the reservoir unit 202 shown in FIG. 3, the chemical solution fed from the chemical solution treatment unit 201 through the chemical solution returning means 204 is stored in the receiving tank 202a at first. Subsequently, the chemical solution inside the receiving tank 202a is fed to the next residence tank 202b through a pipe 212 by a pump (not shown) and allowed to remain therein. The chemical solution inside the residence tank 202b is then fed to the next supplying tank 202c through a pipe 213 by a pump (not shown). The liquid level of each tank can be properly adjusted by using the pump attached to each of the pipes 212 and 213. Each tank may have a liquid level indicator capable of sensing the position of the liquid level and transmitting an on/off signal to a pump. The chemical solution recovered from the chemical solution treatment unit is fed to the supplying tank 202c after the amount of ruthenium components is reduced in the receiving tank 202a and the residence tank 202b, and therefore the amount of the ruthenium components in the chemical solution supplied to the chemical solution treatment unit from the reservoir unit 202 (the supplying tank 202c) can be sufficiently reduced.

The average residence time of the chemical solution in each tank can be properly set, but the sum of the average residence time of the chemical solution in each tank, namely, the average residence time of the chemical solution in the entire reservoir unit 202 is set so that the amount of the ruthenium components in the chemical solution is reduced sufficiently and is kept to be small. In this case, it is also preferable that the amount of ruthenium components in the chemical solution supplied to the chemical solution treatment unit from the reservoir unit (supplying tank) is 2 ppm or less.

In the reservoir unit 202 shown in FIG. 3, the receiving tank 202a, the residence tank 202b and the supplying tank 202c are separated by partitions in one tank and have a clearance part in common, and they have one exhaust duct 208 communicating with the clearance part. But a receiving tank, a residence tank and a supplying tank may be constructed to be an independent tank respectively. When they are constructed to be an independent tank respectively, it is preferable that the receiving tank, the residence tank and the supplying tank each have a clearance part and an exhaust duct.

The number of residence tanks between a receiving tank and a supplying tank is not restricted to one, and the reservoir unit may have two or more residence tanks. When the reservoir unit has two or more residence tanks between the receiving tank and the supplying tank, they may be placed in parallel in two or more lines, but they are preferably placed in series.

Another embodiment of the chemical solution treatment apparatus of the present invention may have two or more aforementioned chemical solution circulation systems for each one of the chemical solution treatment units.

In the chemical solution treatment apparatus having two or more chemical solution circulation systems for each one of the chemical solution treatment units, the chemical solution circulation systems may be put into operation one by one in order (when two chemical solution circulation systems are used, alternately) to circulate the chemical solution, so that the chemical solution treatment is performed for substrates. One of the chemical solution circulation systems operates as long as the amount of the ruthenium components in the chemical solution supplied to the chemical solution treatment unit does not exceed a predetermined amount, and then the operation of the chemical solution circulation system is stopped, and the next chemical solution circulation system is put into operation. The chemical solution circulation systems are designed so that the amount of the ruthenium components in the chemical solution in the suspended chemical solution circulation system(s) are reduced to the predetermined amount or less while the other chemical solution circulation system(s) operates. And the chemical solution circulation systems are designed so that the amount of the ruthenium components in the chemical solution in the operating chemical solution circulation system does not exceed a predetermined amount while the amount of the ruthenium components in the chemical solution in the other suspended chemical solution circulation system(s) are reduced to the predetermined amount or less. It is preferable to perform exhaust of the Ru gas components from the chemical solution inside the reservoir unit in both the operating chemical solution circulation system and the suspended chemical solution circulation system(s). The chemical solution treatment apparatus having two or more chemical solution circulation systems for each one of the chemical solution treatment units provides sufficient performance, even if each of the chemical solution circulation systems (the reservoir units) has a lower removal ability of the ruthenium components from the chemical solution than a chemical solution circulation system which is the only one attached to one chemical solution treatment unit. By performing exhaust of the Ru gas components from the reservoir unit in the operating chemical solution circulation system as well as in the suspended chemical solution circulation system, the increasing speed of the amount of the ruthenium components in the chemical solution in the operating chemical solution circulation system can be suppressed, therefore the stopping time of the suspended chemical solution circulation system can be extended, and in consequence the ruthenium components can be sufficiently removed from the chemical solution in the suspended chemical solution circulation system.

In this case, it is preferable that chemical solution circulation systems are designed so that the amount of the ruthenium components in the chemical solution inside the reservoir unit of each of the chemical solution circulation systems is kept to be 2 ppm or less as well as a chemical solution circulation system which is the only one attached to one chemical solution treatment unit.

It is preferable that a chemical solution treatment unit in the chemical solution treatment apparatus of the present invention has a spin type structure as described above, and especially if it is used for the manufacturing process (cleaning process) of a semiconductor device as will be described later, it is more preferable that a chemical solution treatment unit has a spin type structure of a single wafer type.

Hereinafter, a chemical solution treatment unit having a spin type structure of a single wafer type will be explained with reference to FIG. 2 and FIG. 4.

The chemical solution treatment unit 101 has a support medium 105 to place a semiconductor substrate 106 to be treated, a rotating means for rotating the semiconductor substrate 106 placed on the support medium 105, and a chemical solution supplying nozzle for supplying the chemical solution to the rotating semiconductor substrate, and can spray the chemical solution, which is fed from the reservoir unit 102 through a chemical solution supplying means 103, to the surface of the rotating substrate from the chemical solution supplying nozzle placed above the substrate. Thereby, the ruthenium-based metal formed on the semiconductor substrate can be cleaned and removed, or can be etched.

The chemical solution treatment unit having the above-described structure is preferable for the manufacturing process (cleaning process) of a semiconductor device as will be described later, and it can have a structure suitable for cleaning and removing ruthenium-based metal adhering to an area other than the device forming area of the semiconductor substrate selectively. In this case, it is preferable that the rotating means for rotating the semiconductor substrate placed on the support medium has a structure so that the semiconductor substrate is rotated while being floated by spraying gas to the semiconductor substrate at least from below it.

Figure 4:
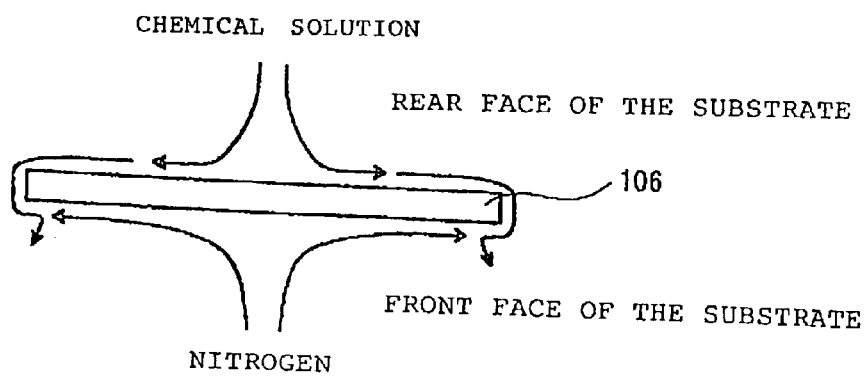
FIG. 4 shows an example of a chemical solution treatment unit of a chemical solution treatment apparatus of the present invention.

In the chemical solution treatment unit shown in FIG. 2 and FIG. 4, the substrate is placed with the surface of the semiconductor substrate (device forming surface) on the side of the support medium, and a gas (inert gas such as nitrogen, air or the like) is sprayed to the surface of the semiconductor substrate (device forming surface) to prevent the chemical solution from adhering to the device forming area (see FIG. 4). For example, the rotating means for rotating the semiconductor substrate may have a floating nozzle for spraying the gas from the side of the undersurface of the semiconductor substrate (the side of the support medium), and a rotating nozzle for giving torque to the floating semiconductor substrate, a gas is sprayed from the side of the undersurface of the semiconductor substrate (the side of the support medium) to float the substrate, and furthermore a gas (not shown) is sprayed to the floating substrate from a predetermined direction to rotate the substrate. In this state, the chemical solution is supplied to the top surface of the placed substrate, namely, the substantially central portion of the rear face of the substrate. The supplied chemical solution is uniformly spread over the entire top surface (rear face) of the substrate by a centrifugal force due to the rotation of the substrate, and the ruthenium-based metal is cleaned and removed. By spraying the gas to the undersurface (device forming surface) of the substrate to float the substrate, the chemical solution dropped onto the top surface (rear face) of the substrate can be prevented from going around to the end face and the undersurface (device forming surface) to protect the device forming surface.

The blast pressure of the gas from the above-described floating nozzle and the rotating nozzle can be properly set. By controlling the blast pressure, the floating amount of the substrate, the rotational speed of the substrate, or the like can be appropriately adjusted. In this situation, the equilibrium state of the blasting force of the chemical solution supplied from the side of the top surface of the substrate (downward pressure to the substrate) and the blasting force of the gas for floating the substrate (upward pressure to the substrate) has to be maintained.

The support medium may have a centering pin for controlling centering of the floating substrate at the periphery.

The chemical solution treatment unit 101 has the exhaust duct 110. In the chemical solution treatment apparatus of the present invention, the chemical solution after using for the cleaning treatment is recovered quickly and discharged from the chemical solution treatment unit, and the ruthenium components in the chemical solution are sufficiently removed in the reservoir unit 102, and therefore the amount of the Ru gas components volatilized in the chemical solution treatment unit 101 can be suppressed.

After coming into contact with the semiconductor substrate in this way, the chemical solution is caught by the waste liquid housing tank 107 below the stage. It is preferable that the waste liquid housing tank 107 has such a height that the chemical solution dropped onto the substrate 106 does not spatter outside the waste liquid housing tank 107. The waste liquid housing tank 107 is connected to the chemical solution returning means 104 for feeding the used chemical solution to the reservoir unit 102. Since the chemical solution after coming into contact with the substrate contains ruthenium components and the Ru gas components are volatilized from the chemical solution gradually, it is preferable to drain the used chemical solution from the chemical solution treatment unit 101 quickly. For this purpose, the waste liquid housing tank 107 may have a sloping bottom face, or the waste liquid housing tank 107 may have two or more waste liquid discharge passages leading to the chemical liquid returning means 104.

The chemical solution treatment unit 101 may comprise a hood to cover from the chemical solution supplying nozzle to the liquid waste housing tank 107 above the support medium 105 so as to prevent the chemical solution supplied from the chemical solution supplying nozzle from spattering and adhering to the inner wall of the chemical solution treatment unit.

Hereinafter, the chemical solution A, which is preferably used in the aforementioned chemical solution treatment apparatus of the present invention and is preferably used in a method for manufacturing a semiconductor device as will be described later, will be explained. The chemical solution A contains at least one compound selected from the group consisting of cerium (IV) nitrate salt and periodic acid (component (a)), and at least one acid selected from the group consisting of nitric acid, perchloric acid and acetic acid (component (b))

Concrete examples of cerium (IV) nitrate salt of the component (a) include ammonium cerium (IV) nitrate, potassium cerium (IV) nitrate or the like. Among them, ammonium cerium (IV) nitrate is preferable because it has less influence on device performance.

The content of the component (a) in the chemical solution is preferably 5% by mass or more, and more preferably, 10% by mass or more in terms of sufficient dissolution and removal of ruthenium-based metal and prevention of re-adhesion of the removed ruthenium-based metal. The content of the component (a) of the chemical solution is preferably 35% by mass or less, more preferably, 30% by mass or less, further more preferably, 25% by mass or less in terms of effective prevention of precipitation of the component (a).

The content of the component (b) in the chemical solution is preferably 1% by mass or more, and more preferably, 5% by mass or more in terms of sufficient dissolution and removal of ruthenium-based metal and prevention of re-adhesion of the removed ruthenium-based metal. The upper limit of the content of the component (b) in the chemical solution is not particularly restricted, but it can be set at, for example, 30% by mass or less.

It is preferable that the chemical solution used in the present invention contains water as component (c) other than the above-described components (a) and (b). The content of the component (c) in the chemical solution can be set at, for example, 35 to 94% by mass. By containing water as component (c), the ruthenium-based metal removing performance of the above-described components (a) and (b) is offered more efficiently.

Instead of the component (c), or in addition to the component (c), the chemical solution may contain a water-soluble organic solvent. As a water-soluble organic solvent, the one having miscibility with water and the other components can be used. The chemical solution used in the present invention may contain other components such as a surfactant other than the aforementioned components.

A preferable chemical solution used in the present invention is the one composed of the above-described components (a), (b) and (c), or the one with a small amount of an additive or the like being added to them (components (a), (b) and (c)).

Hereinafter, a method for manufacturing a semiconductor device of the present invention will be explained. The aforementioned chemical solution treatment apparatus and the chemical solution A may be preferably used in a cleaning process in the method.

In the method for manufacturing the semiconductor device of the present invention, after a ruthenium-based metal film is formed in an device forming area on a substrate, ruthenium-based metal which adheres to an area other than the device forming area on forming the ruthenium-based metal film, is removed by performing cleaning treatment using the aforementioned chemical solution treatment apparatus of the present invention and the chemical solution A. Especially, it is preferable to place the semiconductor substrate with its device forming surface having the device forming area downward, and supply the chemical solution from above to the other surface of the semiconductor substrate to perform cleaning treatment, while spraying a gas to the device forming surface and floating and rotating the semiconductor substrate, in the chemical solution treatment unit of the chemical solution treatment apparatus.

Figure 5:
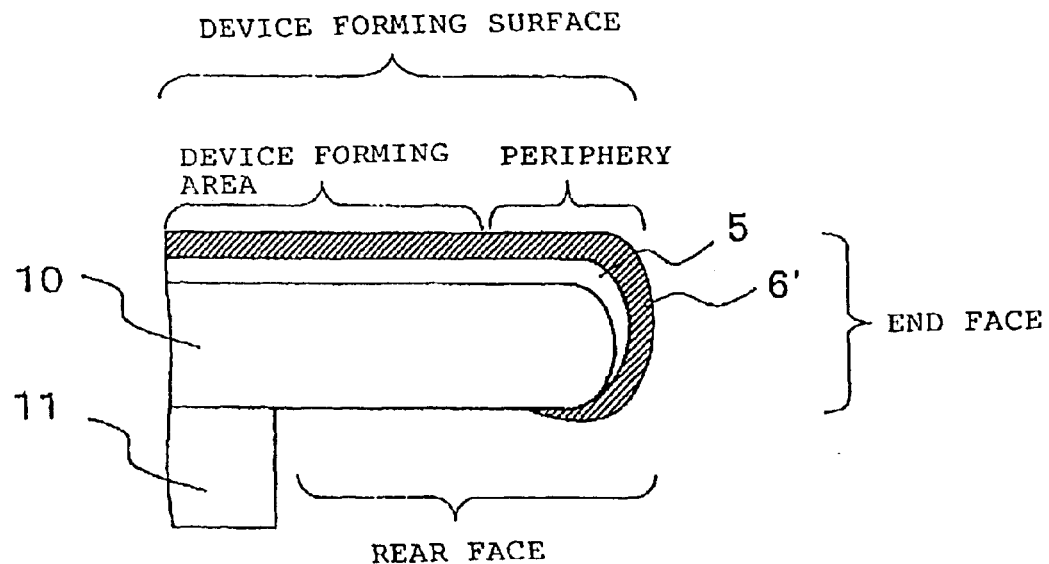
FIG. 5 shows an appearance of a silicon substrate after formation of a lower electrode film in a manufacturing process of a capacitor.
Figure 6:
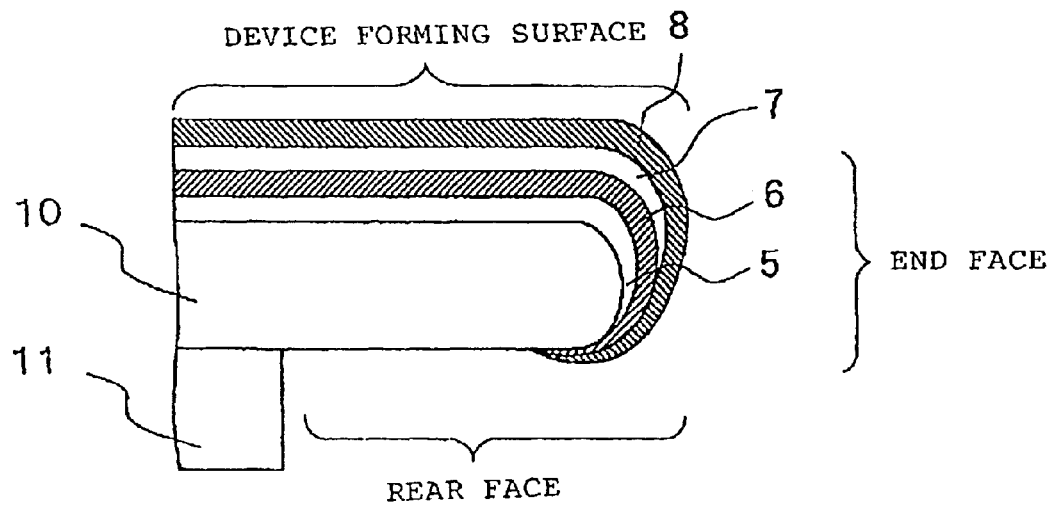
FIG. 6 shows an appearance of a silicon substrate after formation of an upper electrode film in a manufacturing process of a capacitor.

The term "an area other than a device forming area" includes the end face and the rear face of a semiconductor substrate and also peripheral areas of the device forming surface. FIG. 5 and FIG. 6 show one example thereof.

When a ruthenium film is formed on a substrate surface, unneeded ruthenium-based metal sometimes adheres to a zonal area within about 2 mm from the edge of the substrate surface (periphery), the end face of the substrate, and the rear face of the substrate. In the present invention, such the ruthenium-based metal adhering to an area other than the device forming area is cleaned and removed efficiently and in the better operation environment. The area within about 2 mm from the edge of the substrate surface corresponds to an area where a handler and a carrier are in contact with a wafer.

It is preferable that the temperature of the chemical solution is a substantially constant temperature in the range of room temperature ±10° C. within the limits of 50° C. and specifically, it is preferably in the range of 10 to 50° C., more preferably, in the range of 20 to 40° C. when the component (a) is cerium (IV) nitrate salt. When the component (a) is periodic acid, the temperature of the chemical solution is preferably in the range of 50 to 60° C. within the limits of 70° C. If the temperature of the chemical solution is too high, it is difficult to obtain a desired effect of the chemical solution due to concentration of the chemical solution, and therefore it is preferable to perform chemical solution treatment at the solution temperature in the above-described range.

Since the present invention make it possible to perform cleaning efficiently in the better operation environment, and to realize prevention of contamination at an extremely high level (a residual ruthenium is $10^9$ atoms/cm$^2$ order), it may be especially suitable for a manufacturing process of a DRAM or FeRAM comprising the step of forming a capacitor which comprises a ruthenium-based metal film as an electrode. Generally, the manufacturing process of a DRAM or FeRAM requires prevention of contamination at a higher level as compared with the manufacturing process of the other semiconductor device.

In the present invention, examples of a semiconductor substrate include a silicon substrate as well as a III-V group compound semiconductor substrates such as GaAs, InP, and GaN, and a II-VI group compound semiconductor substrates such as ZnSe. The present invention is especially suitable to the treatment of a silicon substrate. The cleaning using the chemical solution A and the chemical solution treatment apparatus of the present invention is excellent in the performance of removing ruthenium-based metal, and therefore when it is applied to a silicon substrates having the problem of the deterioration in device performance due to diffusion of the ruthenium in the substrate, more remarkable effect can be obtained.

Hereinafter, a preferable embodiment of a method for manufacturing a semiconductor device of the present invention will be explained with reference to FIG. 5 to FIG. 8, taking a manufacturing process of a capacitor for a DRAM for an example. In the present embodiment, a capacitor is formed, where a lower electrode film, a capacitance insulating film and an upper electrode film are laminated in a concave in an insulating film on a semiconductor substrate.

First, as shown in FIG. 7(a), after an MOS transistor comprising a source/drain diffusion area (not shown) is formed on a silicon substrate 1, an interlayer insulating film 2 is formed on an entire surface of the silicon substrate 1. Then, a contact plug 4 is formed on the diffusion area not shown. A buried material of the contact plug 4 may be polysilicon, tungsten or the like. After forming the plug, the entire surface of the substrate is flattened, and an interlayer insulating film 3 is formed on the surface.

Figure 7:
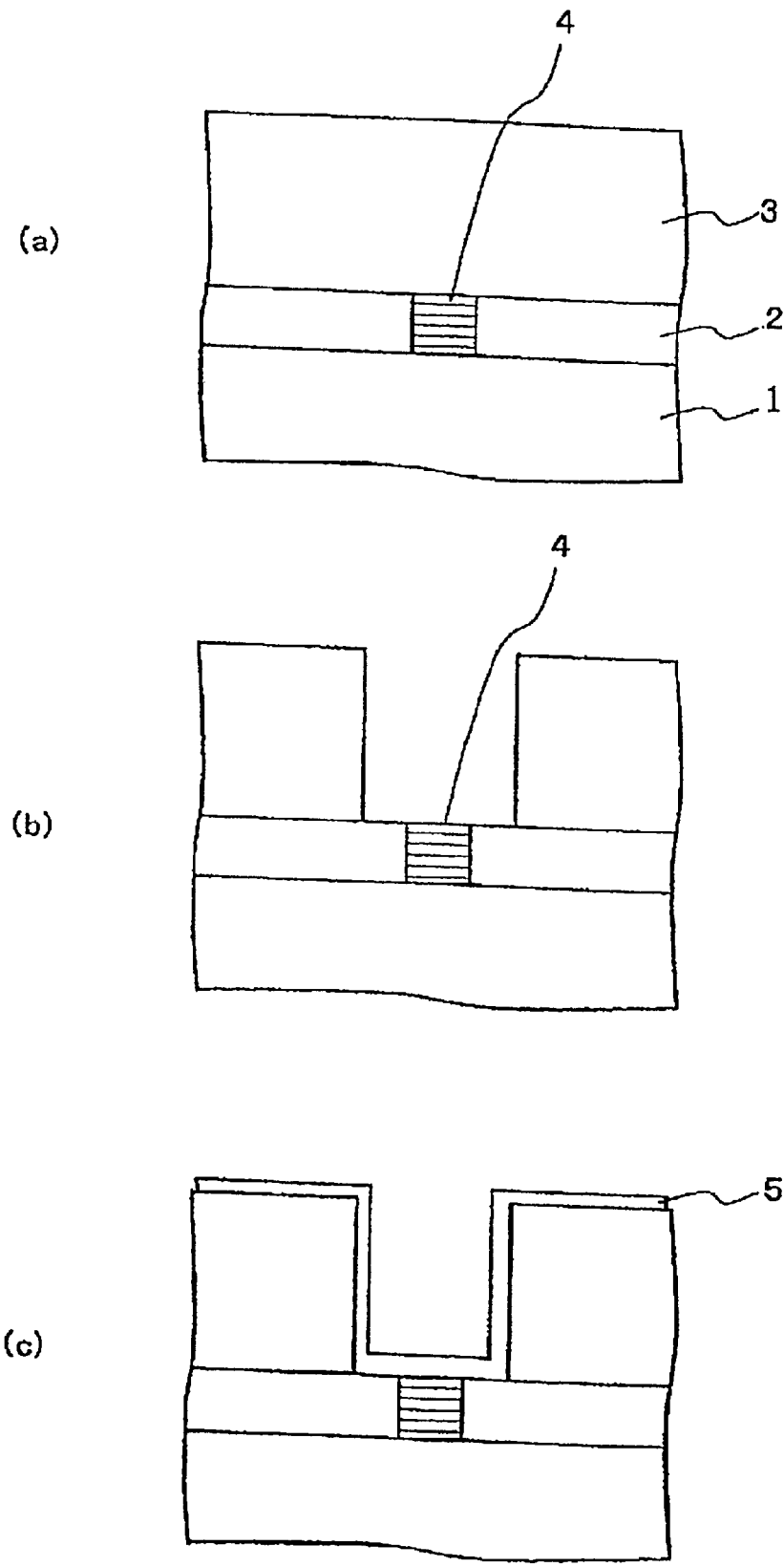
FIG. 7 shows an example of a method of the present invention applied to a manufacturing process of a capacitor in section.

Then, dry etching is performed to form a hole reaching the contact plug 4 in the interlayer insulating film 3 (FIG. 7(*b*)). In this case, the cross-section of the hole may be an ellipse having a dimension of, for example, the short axis of about 0.2 $\mu$m, and the long axis of about 0.4 $\mu$m.

Subsequently, a contact film 5 is formed on the entire surface of the substrate (FIG. 7(*c*)). The contact film 5 may be, for example, a film consisting of Ti, TiN, Ta and TaN in this order, and may be formed by sputtering method, CVD method or the like.

Figure 8:
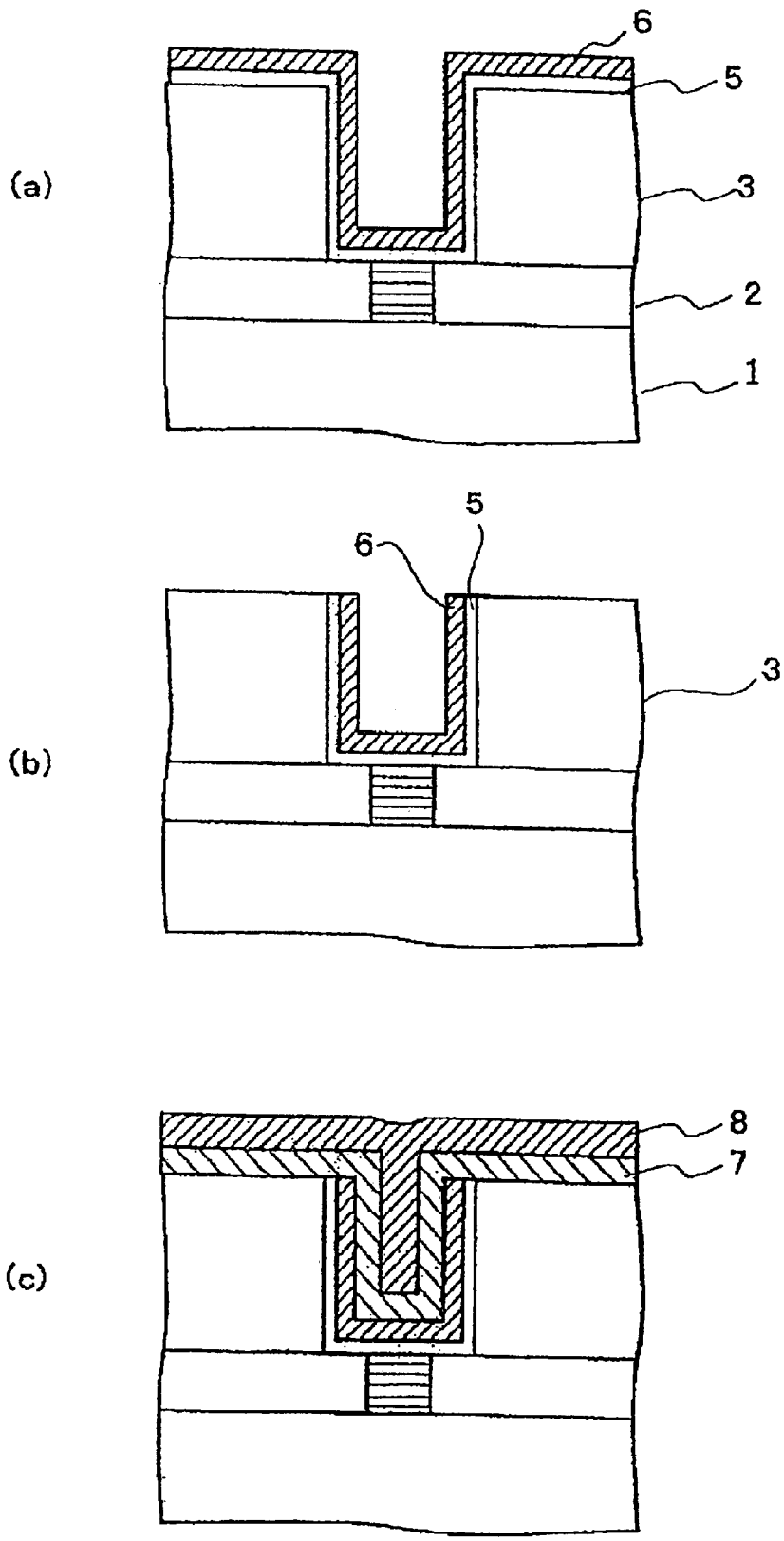
FIG. 8 shows an example of a method of the present invention applied to a manufacturing process of a capacitor in section.

Then, a lower electrode film 6 composed of ruthenium is formed on the entire surface of the substrate (FIG. 8(*a*)). By using ruthenium as an electrode material, reduction in the capacitance caused by oxidization of the electrode material can be effectively prevented, and the production cost can be reduced. A film composed of ruthenium may be formed by sputtering method, CVD method or the like, and among them, the CVD method is preferable. This is because the CVD method is the most suitable to form a ruthenium thin film in a narrow hole shown in FIG. 8(*a*) with uniform and satisfactory coverage. In case of the CVD method, a source gas may be, for example, bis-(ethylcyclopentadienyl) ruthenium. Before the ruthenium film is formed by the CVD method, a thin ruthenium film may be formed by the sputtering method as a seed film.

Then, spin cleaning is performed with use of the chemical solution treatment apparatus of the present invention and the chemical solution A so as to remove the ruthenium-based metal adhering to an area other than the device forming area on the silicon substrate. When the lower electrode film 6 composed of ruthenium is formed by the CVD method, ruthenium 6' adheres to an end face and a rear face of a semiconductor substrate 10 as shown in FIG. 5. The silicon substrate 10 shown in FIG. 5 corresponds to that in the state after the step of FIG. 8(*a*) is finished.

In this case, with the object to remove the ruthenium-based metal adhering to the area other than the device forming area, it is desired to prevent the chemical solution from adhering to the device forming area on performing the chemical solution treatment. Therefore, it is preferable to perform spin cleaning by the aforementioned method shown in the FIG. 4, that is, to perform spin cleaning by dropping the chemical solution onto the rear face of the substrate while preventing the chemical solution from adhering to the device forming area by spraying a gas such as nitrogen to the surface of the semiconductor substrate (device forming surface).

When the aforementioned chemical solution treatment is performed, it sometimes happens that cerium (IV) nitrate salt precipitates and remains on the semiconductor substrate 10. Therefore, after the cleaning treatment by the aforementioned chemical solution is performed, the residue of the chemical solution may be removed with a cleaning solution. By cleaning and removing it, cross contamination between devices and wafers can be further effectively prevented, and a yield can be increased and reliability of device can be further improved.

The preferable cleaning solution is a solution containing hydrofluoric acid, because it can dissolve and remove cerium (IV) nitrate salt effectively and can prevent the removed cerium (IV) nitrate salt from adhering again. Concrete examples of the solution containing hydrofluoric acid include an aqueous solution of hydrofluoric acid, an aqueous solution of nitric acid and hydrofluoric acid, or the like. The concentration of the hydrofluoric acid may be, for example, from 0.1% by mass to 60% by mass.

Subsequently, unnecessary portions of the contact film 5 and the lower electrode film 6 are removed by etch back or chemical mechanical polishing (CMP). The state after removal is shown in FIG. 8(*b*). By making the contact film 5 and the lower electrode film 6 have the same height as the interlayer insulating film 3, electrodes of the other adjacent capacitors and the lower electrode film 6 can be prevented from being in contact with each other.

Then, a capacitance insulating film 7 composed of $Ta_2O_5$, and an upper electrode film 8 composed of ruthenium are formed on the entire surface of the substrate in this order (FIG. 8(*c*)).

The capacitance insulating film 7 may be formed by the CVD method using pentaethoxytantalum and oxygen as main materials. A dielectric material constituting the capacitance insulating film 7 may be a perovskite material such as BST ($Ba_xSr_{1-x}TiO_3$), PZT ($PbZr_xTi_{1-x}O_3$), PLZT ($Pb_{1-y}La_yZr_xTi_{1-x}O_3$,), and $SrBi_2Ta_2O_9$ other than $Ta_2O_5$. The capacitance insulating films may be formed by any method, such as the CVD method, sol-gel method, sputtering method or the like.

After the upper electrode film is formed, the ruthenium-based metal is cleaned and removed with use of the chemical solution treatment apparatus of the present invention and the chemical solution A again. The state of the substrate just before this chemical solution treatment is as shown in FIG. 6, and the capacitance insulating film 7 and the upper electrode film 8 are formed on the end face and the rear face of the silicon substrate 10. Consequently, the ruthenium-based metal adhering to the area other than the device forming area (the upper electrode film 8 formed on the end face and the rear face of the substrate) is cleaned and removed.

After the aforementioned chemical solution treatment is performed, the residue of the above-described chemical solution may be removed using a cleaning solution. The preferable cleaning solution is a solution containing hydrofluoric acid. By using an aqueous solution of preferably 20% by mass or more hydrofluoric acid as the cleaning solution, $Ta_2O_5$ and ruthenium-based metal adhering to the end face and the rear face of the silicon substrate can be removed at the same time.

Thereafter, dry etching is performed, and the capacitance insulating film 7 and the upper electrode film 8 are separated into chip units. As described above, the cell capacitor of the DRAM, which consists of the contact film 5, the lower electrode film 6, the capacitance insulating film 7 and the upper electrode film 8, is formed.

In this embodiment, chemical solution treatment to clean and remove the ruthenium-based metal is performed twice after formation of the lower electrode and after formation of the upper electrode. Such a procedure is the most preferable, but the ruthenium-based metal may be cleaned and removed only after formation of the upper electrode.

In this embodiment, cleaning treatment to remove the residue of the chemical solution is performed twice after the chemical solution treatment to remove the ruthenium-based metal after formation of the lower electrode, and after the chemical solution treatment to remove the ruthenium-based metal after formation of the upper electrode. Such a procedure is the most preferable, but the above-described cleaning treatment may be performed only after the formation of the upper electrode, or only after the formation of the lower electrode.

After forming the ruthenium film, a brush scrub cleaning process may be performed. Thereby, particulate contaminants such as ruthenium, which adhere to the rear face and the periphery of the surface (device forming surface) of the semiconductor substrate in the step of forming the ruthenium film, can be efficiently removed. A cleaning solution used in the brush scrub cleaning process may be pure water, ammonia water, electrolytic cathode water, hydrogen-dissolving water or the like, and an additive such as a surfactant may be added as appropriate.

After the chemical solution treatment for removal of the ruthenium-based metal, and after cleaning treatment of the residue of the chemical solution, a pure water rinse process may be performed. Specifically, the surface having the device forming area of the semiconductor substrate may be washed by spraying water to it.

In this embodiment, both the lower electrode film 6 and the upper electrode film 8 are ruthenium films, but only one of them may be a ruthenium film. An electrode other than a ruthenium film may be, for example, a platinum film, a laminated film of an iridium film and an iridium oxide film, or the like.

The thickness of each film constituting the capacitor is properly set depending on the diameter of the concave in FIG. 7 and FIG. 8 or the like. For example, when the diameter of the concave is about 0.2 $\mu$m, the thickness of the contact film 5 may be about 5 to 30 nm, the thickness of the lower electrode film 6 and the thickness of the upper electrode film 8 may be about 20 to 50 nm, and the thickness of the capacitance insulating film 7 may be about 5 to 20 nm.

There are no particular restrictions to the form of the capacitor to which the present invention may be applied. In the above embodiment, the capacitor is formed in the concave in the insulating film on the semiconductor substrate, but a salient may be formed in the insulating film and then a capacitor may be formed at the salient. In this case, the form of the capacitor is a so-called cylinder type. Other than these forms, the present invention may be applied in forming various capacitors such as a planar type, a stack type, and a fin type.

The present invention may be preferably applied not only to DRAM and FeRAM, but also to SOC comprising DRAM or FeRAM and a logic device, or the like.

What is claimed is:

1. A chemical solution treatment apparatus for dissolving and removing ruthenium-based metal adhering to a semiconductor substrate by a chemical solution, comprising:

a chemical solution treatment unit which make the semiconductor substrate come into contact with said chemical solution;

a reservoir unit for storing the chemical solution which is used in said chemical solution treatment unit; and a chemical solution circulation system having said reservoir unit, a chemical solution supplying means for supplying the chemical solution inside said reservoir unit to said chemical solution treatment unit, and a chemical solution returning means for returning the chemical solution, which is used and recovered in said chemical solution treatment unit, to said reservoir unit, wherein:

said chemical solution treatment unit comprises a chemical solution supplying nozzle for supplying the chemical solution to the semiconductor substrate, and a recovering mechanism for recovering the used chemical solution;

said reservoir unit has a structure having a clearance part to be in contact with the chemical solution so that gas components derived from the ruthenium-based metal dissolved and removed in said chemical solution treatment are volatilized outside the chemical solution during circulation of the chemical solution, and comprises an exhaust duct to forcefully exhaust said volatilized gas components out of said reservoir unit; and the residence time of the chemical solution in the chemical solution treatment unit after coming in contact with the semiconductor substrate is shorter than the residence time of the chemical solution in the reservoir unit.

2. The chemical solution treatment apparatus according to claim 1, comprising a removing means for removing said gas components inside a passage of said exhaust duct.

3. The chemical solution treatment apparatus according to claim 1, wherein said chemical solution treatment unit has a single wafer type of structure having a rotating means for rotating the placed semiconductor substrate substantially horizontally and having said chemical solution supplying nozzle placed at a side of top surface of the rotating semiconductor substrate.

4. The chemical solution treatment apparatus according to claim 2, wherein said removing means has activated carbon.

5. The chemical solution treatment apparatus according to claim 2, wherein a bent pipe capable of condensing water in the gas exhausted from said reservoir unit is connected to said exhaust duct, and said removing means is at a rear stage of the bent pipe.

6. The chemical solution treatment apparatus according to claim 1, wherein said chemical solution circulation system makes the chemical solution remain in said reservoir unit so that the amount of ruthenium components in the chemical solution supplied from said reservoir unit to said chemical solution treatment unit is kept to be a predetermined amount or less.

7. The chemical solution treatment apparatus according to claim 1, wherein in said chemical solution circulation system, a gas-liquid contact area of the chemical solution inside said reservoir unit is designed depending on a forceful exhaust velocity of said reservoir unit.

8. The chemical solution treatment apparatus according to claim 7, wherein a forceful exhaust means is connected to said reservoir unit.

9. The chemical solution treatment apparatus according to claim 1, wherein said reservoir unit has a receiving tank for receiving the chemical solution recovered from said chemical solution treatment unit, at least one residence tank for allowing the chemical solution from the receiving tank to remain therein, and a supplying tank for receiving the chemical solution from the residence tank and supplying it outside the reservoir unit.

10. The chemical solution treatment apparatus according to claim 1, comprising two or more of said chemical solution circulation systems for each of said chemical solution treatment units.

11. The chemical solution treatment apparatus according to claim 10, wherein two or more of said chemical solution circulation systems are designed so that the amount of the ruthenium components in the chemical solution inside the reservoir unit of each of the chemical solution circulation systems is kept to be a predetermined amount or less while it is switched to be circulated in order.

12. The chemical solution treatment apparatus according to claim 1, wherein said chemical solution is a chemical solution comprising at least one compound selected from the group consisting of cerium (IV) nitrate salt and periodic acid, and at least one acid selected from the group consisting of nitric acid, perchloric acid, and acetic acid.

* * * * *